United States Patent
Lee

(10) Patent No.: US 7,276,439 B2
(45) Date of Patent: Oct. 2, 2007

(54) METHOD FOR FORMING CONTACT HOLE FOR DUAL DAMASCENE INTERCONNECTION IN SEMICONDUCTOR DEVICE

(75) Inventor: Kang-Hyun Lee, Yongin (KR)

(73) Assignee: Dongbu Electronics Co., Ltd., Seoul (KR)

( * ) Notice: Subject to any disclaimer, the term of this patent is extended or adjusted under 35 U.S.C. 154(b) by 194 days.

(21) Appl. No.: 11/024,847

(22) Filed: Dec. 30, 2004

(65) Prior Publication Data

US 2005/0142859 A1    Jun. 30, 2005

(30) Foreign Application Priority Data

Dec. 31, 2003    (KR) .................. 10-2003-0101793

(51) Int. Cl.
*H01L 21/4763* (2006.01)

(52) U.S. Cl. ...................... 438/622; 438/618

(58) Field of Classification Search ............... 438/618, 438/622
See application file for complete search history.

(56) References Cited

U.S. PATENT DOCUMENTS

| 6,924,228 | B2* | 8/2005 | Kim et al. | 438/636 |
|---|---|---|---|---|
| 2002/0182880 | A1* | 12/2002 | Zhu et al. | 438/724 |
| 2005/0142832 | A1 | 6/2005 | Lee | |
| 2005/0142859 | A1 | 6/2005 | Lee | |

* cited by examiner

*Primary Examiner*—M. Wilczewski
*Assistant Examiner*—Pamela E Perkins
(74) *Attorney, Agent, or Firm*—Lowe Hauptman Ham & Berner LLP

(57) ABSTRACT

A method for forming a contact hole for a dual damascene interconnection in a semiconductor device. A via hole is formed to expose an etch stop film on a lower metal film through an intermetal insulating film. The via hole is filled with a sacrificial film. A bottom antireflective coating film and a mask pattern are formed on the intermetal insulating film and the sacrificial film. An etching process is performed to form a trench to expose a portion of a surface of the intermetal insulating film and a top surface of the sacrificial film. A post etch treatment is performed to remove the sacrificial film, using the mask pattern as an etching mask. The exposed etch stop film is removed to expose a portion of a surface of the lower metal film. A passivation process is performed for the exposed surface of the lower metal film.

16 Claims, 5 Drawing Sheets

METHOD FOR FORMING CONTACT HOLE FOR DUAL DAMASCENE INTERCONNECTION IN SEMICONDUCTOR DEVICE

BACKGROUND OF THE INVENTION (a) Field of the Invention

The present invention relates to a method for fabricating a semiconductor device, and more particularly to a method for forming a contact hole for a dual damascene interconnection in the semiconductor device.

(b) Description of the Related Art

Recently, known dual damascene processes have been used for formation of metal interconnections in semiconductor integrated circuit devices. The known dual damascene process includes forming contact holes defining interconnection regions, and completing dual damascene interconnections by filling the interconnections with a conductive film using a physical deposition process.

FIGS. 1 to 4 are sectional views illustrating a method for forming a contact hole for a dual damascene interconnection in the conventional semiconductor device.

As shown in FIG. 1, an etch stop film 104 and an insulating 106 are sequentially formed on a lower metal film 102 made of copper (Cu). A first photoresist film pattern 108 is formed on the insulating film 106. Then, a via hole 110 is formed to expose a portion of a surface of the etch stop film 104 through the insulating film 106. The via hole 110 is formed by performing an etching process using the first photoresist film pattern 108 as an etching mask.

As shown in FIG. 2, the first photoresist film pattern 108 is removed, and the via hole 110 is filled with a photoresist film used as a sacrificial film 112. After forming the sacrificial film 112, the sacrificial film on the insulating film 106 is removed by performing a known etch back process. Subsequently, a bottom antireflective coating (BARC) film 114 is formed on the insulating film 106 and the sacrificial film 112.

As shown in FIG. 3, a second photoresist film pattern 116 is formed on the BARC film 114. An exposed portion of the BARC film 114 is removed by performing an etching process using the second photoresist film pattern 116 as an etching mask. Thereafter, exposed portions of the insulating film 106 and the sacrificial film 112 are removed to form a trench 118.

As shown in FIG. 4, the second photoresist film pattern 116, the BARC film 114, and the sacrificial film 112 are sequentially removed to expose a portion of the etch stop film 104. Then, the exposed portion of the etch stop film 104 is removed to form a contact hole, which includes the via hole 110 for exposing a portion of a surface of the lower metal film 102 and the trench 118.

By the above described method, the sacrificial film 112 is formed in order to prevent the lower metal film 102 from being etched when the etch stop film 104 is removed to form the trench 118. However, an additional ashing process is required to remove the sacrificial film 112. Additionally, the exposed surface of the lower metal film 102 is corroded or oxidized as the lower metal film 102 is exposed after removal of the etch stop film 104.

SUMMARY OF THE INVENTION

To address the above-described and other problems, it is an object of the present invention to provide a method for forming a contact hole for a dual damascene interconnection in a semiconductor device, which is capable of avoiding unnecessary processing, such as an ashing process for removing a sacrificial film, and improving contact resistance while preventing or reducing corrosion or oxidation of an exposed surface of a lower metal film.

Accordingly, the present invention provides a method for forming a contact hole for a dual damascene interconnection in a semiconductor device. A via hole is formed to expose an etch stop film on a lower metal film through an intermetal insulating film. The via hole is filled with a sacrificial film. A bottom antireflective coating film and a mask pattern are formed on the intermetal insulating film and the sacrificial film. An etching process is performed to form a trench to expose a portion of a surface of the intermetal insulating film and a top surface of the sacrificial film. A post etch treatment is performed to remove the sacrificial film, using the mask pattern as an etching mask. The exposed etch stop film is removed to expose a portion of a surface of the lower metal film. A passivation process is performed for the exposed surface of the lower metal film.

It is to be understood that both the foregoing general description of the invention and the following detailed description are exemplary, but are not restrictive of the invention.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE INVENTION

The present invention is now described with reference to the accompanying drawings. It is to be understood, however, that the scope of the claimed invention is not limited by this disclosure.

Figure 1:
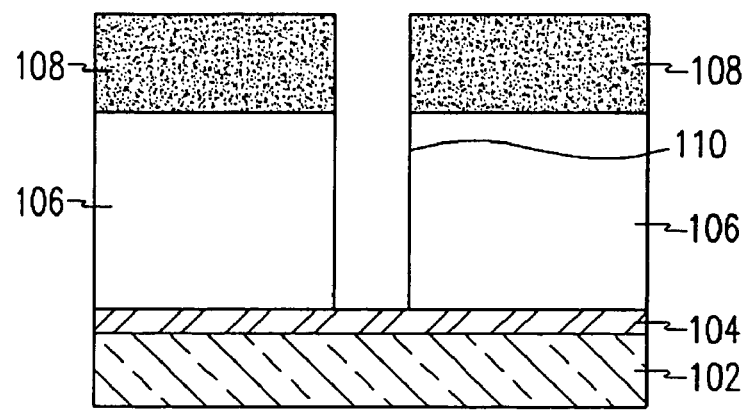
FIGS. 1 to 4 are sectional views illustrating a method for forming a contact hole for a dual damascene interconnection in a conventional semiconductor device.
Figure 2:
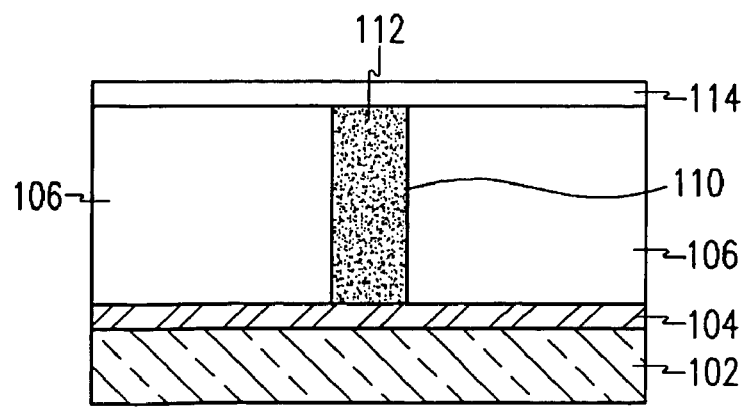
Figure 3:
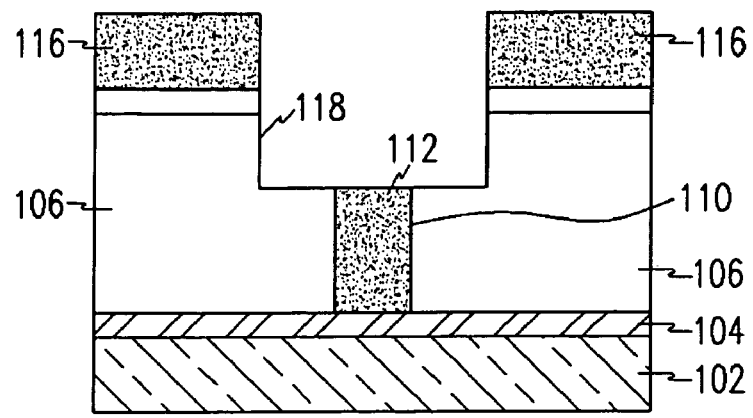
Figure 4:
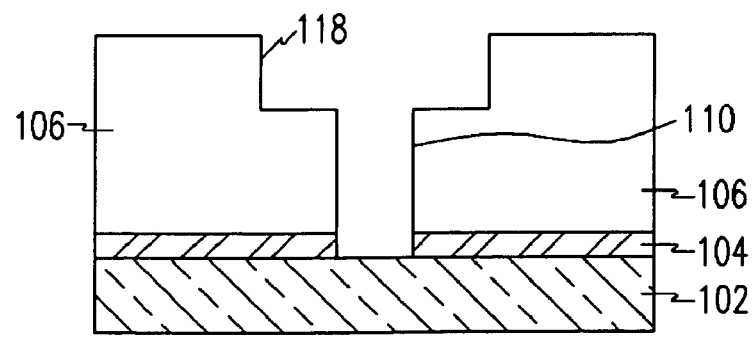
Figure 5:
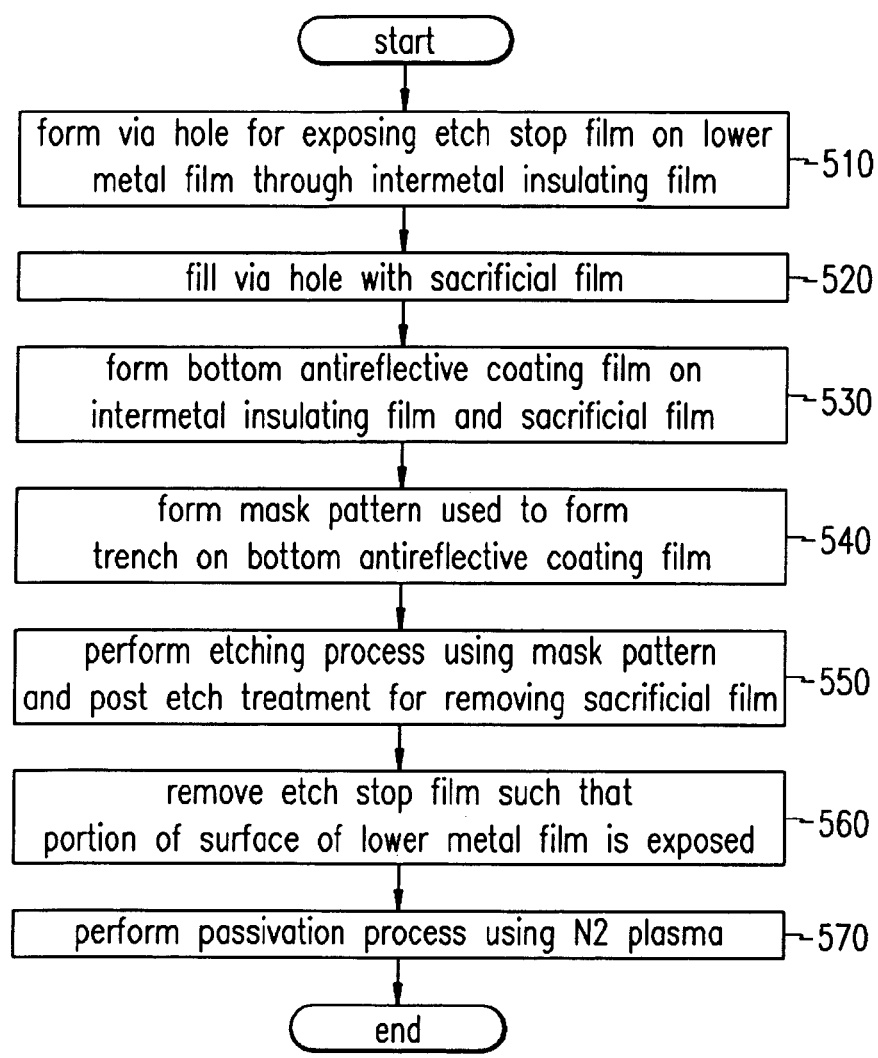
FIG. 5 is a flow chart illustrating a method for forming a contact hole for a dual damascene interconnection in a conventional semiconductor device.

FIG. 5 is a flow chart illustrating a method for forming a contact hole for a dual damascene interconnection in a semiconductor device according to the present invention. FIGS. 6 to 9 are sectional views illustrating the method according to FIG. 5.

Figure 6:
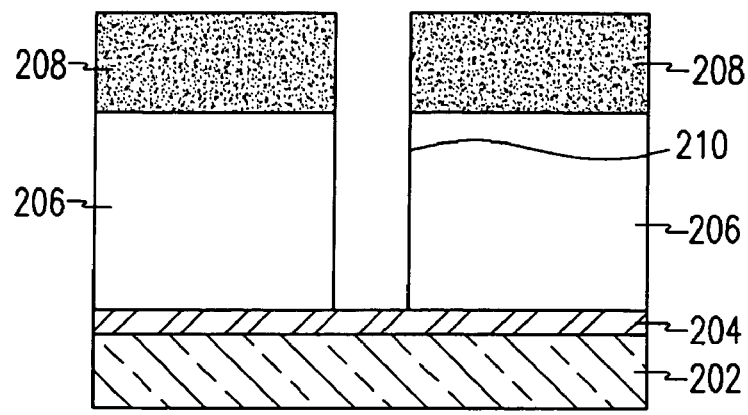
FIGS. 6 to 9 are sectional views illustrating the method of FIG. 5.

As shown in Step 510 of FIG. 5, a via hole is formed to expose an etch stop film on a lower metal film through an intermetal insulating film. As shown in FIG. 6, an etch stop film 204 is formed on a lower metal film 202. The metal film 202 can be formed as a copper (Cu) film. Although not shown in the drawings, the lower metal film 202 can be electrically connected to an impurity region of a semiconductor substrate or other interconnection layers. The etch stop film 204 can be formed as a nitride film.

An intermetal insulating film 206 and a first photoresist pattern 208 are formed on the etch stop film 204. A via hole 210 for exposing a portion of a surface of the etch stop film 204 is formed by removing an exposed portion of the intermetal insulating film 206 in an etching process. During the etching process, the first photoresist pattern 208 can be used as an etching mask.

Figure 7:
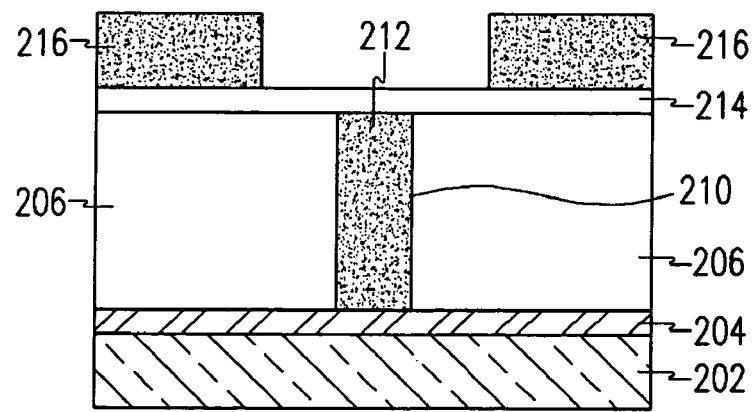

As shown in FIG. 7, the first photoresist pattern 208 is removed, and the via hole 210 is filled with a sacrificial film 212 (Step 520 in FIG. 5). The sacrificial film 212 can be formed as a photoresist film, which is easily removable in a subsequent process without affecting the etch stop film 204. The sacrificial film 212 is also formed on the intermetal insulating film 206.

The intermetal insulating film 206 is exposed by performing an etching process for removing the sacrificial film 212. An example of such an etching process includes an etch-back process. A bottom antireflective coating (BARC) film 214 is formed on the intermetal insulating film 206 and the sacrificial film 212 (Step 530 of FIG. 5).

Figure 8:
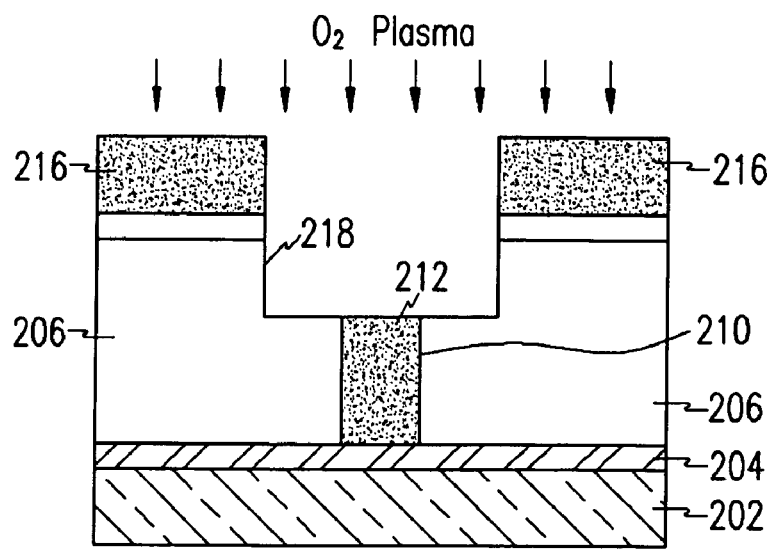

A second photoresist pattern 216 is formed on the BARC film 214 (Step 540 of FIG. 5). As shown in FIG. 8, an etching process using the second photoresist pattern 216 and a post etch treatment (PET) for removing the sacrificial film 212 are performed (Step 550 in FIG. 5).

Specifically, an exposed portion of the BARC film 214 is removed by performing an etching process using the second photoresist pattern 216 as an etching mask. Examples of such an etching process include a plasma etching process using $C_xF_y/O_2$ gas.

An etching process for the intermetal insulating film 206 is performed. Examples of such an etching process include a plasma etching process using $C_xF_y$ gas. After completing theses etching processes, a trench 218 is formed to expose the entire top surface of the sacrificial film 212 formed in the via hole 210.

The sacrificial film 212 is removed by performing a PET. Examples of such a PET include $O_2$ plasma. The second photoresist pattern on the intermetal insulating film 206 is also removed.

Figure 9:
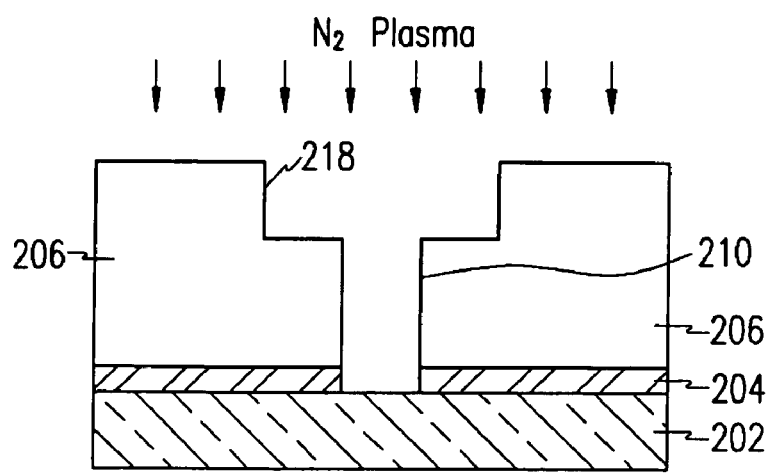

As shown in FIG. 9, the exposed portion of the etch stop film 204 is removed such that a portion of a surface of the lower metal film 202 is exposed (Step 560 of FIG. 5). An etching process for removing the exposed portion of the etch stop 204 may include a plasma etching process using $C_xF_y$ gas.

A contact hole, which includes the via hole 210 and the trench 218, is formed by performing a passivation process using $N_2$ plasma (Step 570 in FIG. 5). This passivation process prevents or minimizes corrosion or oxidation of the exposed surface of the lower metal film 202.

As discussed above, with the method for forming a contact hole for a dual damascene interconnection in a semiconductor device according to the present invention, the sacrificial film is removed by the PET after the etching process for formation of the trench. Thus, an additional ashing process is not required for removing the sacrificial film. In addition, although the lower metal film is exposed when the etch stop film is removed, the passivation process can prevent or minimize corrosion or oxidation of the exposed surface of the lower metal film.

Although the preferred embodiment of the present invention has been described in detail hereinabove, it is to be understood that many variations and/or modifications of the basic inventive concepts herein taught which may appear to those skilled in the present art are within the spirit and scope of the present invention, as recited in the claims.

The present application incorporates by reference in its entirety the application for a METHOD FOR FABRICATING THE CONTACT HOLE FOR DUAL DAMASCENE INTERCONNECTION IN SEMICONDUCTOR DEVICE filed in the Korean Industrial Property Office on Dec. 31, 2003, and there duly assigned Ser. No. 10-2003-0101793.

What is claimed is:

1. A method for forming a contact hole for a dual damascene interconnection in a semiconductor device, comprising the steps of: forming a via hole to expose an etch stop film on a lower metal film through an intermetal insulating film; filling the via hole with a sacrificial film; forming a bottom antireflective coating film and a mask pattern on the intermetal insulating film and the sacrificial film; performing an etching process to form a trench to expose a portion of a surface of the intermetal insulating film and a top surface of the sacrificial film; performing a post etch treatment to remove the sacrificial film, using the mask pattern as an etching mask; removing the exposed etch stop film to expose a portion of a surface of the lower metal film; and performing a passivation process for the exposed surface of the lower metal film.

2. The method according to claim 1, wherein the sacrificial film comprises a photoresist film.

3. The method according to claim 1, wherein performing the etching process to form the trench comprises: removing the bottom antireflective coating film with an etching process; and removing the intermetal insulating film with an etching process.

4. The method according to claim 3, wherein removing the bottom antireflective coating film comprises etching with a plasma etching process using $C_xF_y/O_2$ gas.

5. The method according to claim 3, wherein removing the intermetal insulating film comprises etching with a plasma etching process using $C_xF_y$ gas.

6. The method according to claim 1, wherein performing the post etch treatment comprises performing the treatment using $O_2$ plasma.

7. The method according to claim 1, wherein removing the etch stop film comprises etching with a plasma etching process using $C_xF_y$ gas.

8. The method according to claim 1, wherein performing the passivation process comprises performing the passivation process using $N_2$ plasma.

9. A method for forming a contact hole for a dual damascene interconnection in a semiconductor device, comprising the steps of: step for forming a via hole to expose an etch stop film on a lower metal film through an intermetal insulating film; step for filling the via hole with a sacrificial film; step for forming a bottom antireflective coating film and a mask pattern on the intermetal insulating film and the sacrificial film; step for performing an etching process to form a trench to expose a portion of a surface of the intermetal insulating film and a top surface of the sacrificial film; step for performing a post etch treatment to remove the sacrificial film, using the mask pattern as an etching mask; step for removing the exposed etch stop film to expose a portion of a surface of the lower metal film; and step for performing a passivation process for the exposed surface of the lower metal film.

10. The method according to claim 9, wherein the sacrificial film comprises a photoresist film.

11. The method according to claim 9, wherein the step for performing the etching process to form the trench comprises: step for removing the bottom antireflective coating film with an etching process; and step for removing the intermetal insulating film with an etching process.

12. The method according to claim 11, wherein the step for removing the bottom antireflective coating film comprises step for etching with a plasma etching process using $C_xF_y/O_2$ gas.

13. The method according to claim 11, wherein the step for removing the intermetal insulating film comprises step for etching with a plasma etching process using $C_xF_y$ gas.

14. The method according to claim 9, wherein the step for performing the post etch treatment comprises step for performing the treatment using $O_2$ plasma.

15. The method according to claim 9, wherein the step for removing the etch stop film comprises step for etching with a plasma etching process using $C_xF_y$ gas.

16. The method according to claim 9, wherein the step for performing the passivation process comprises step for performing the passivation process using $N_2$ plasma.

* * * * *